United States Patent [19]
Kawano

[11] Patent Number: 5,898,704
[45] Date of Patent: Apr. 27, 1999

[54] PROCESSING SYSTEM HAVING TESTING MECHANISM

[75] Inventor: Kayoko Kawano, Kawasaki, Japan

[73] Assignee: Fujitsu Limited, Kawasaki, Japan

[21] Appl. No.: 08/878,121

[22] Filed: Jun. 18, 1997

[30] Foreign Application Priority Data

Nov. 13, 1996 [JP] Japan .................................. 8-302010

[51] Int. Cl.$^6$ ................................................. G01R 31/28
[52] U.S. Cl. ................................. 371/22.32; 371/22.34
[58] Field of Search .......................... 371/22.32, 22.31, 371/22.1, 22.34, 22.35, 22.33, 22.36, 22.5, 22.6, 27.1, 27.2, 27.5, 27.6, 27.7; 395/183.06

[56] References Cited

U.S. PATENT DOCUMENTS

| | | | |
|---|---|---|---|
| 5,377,198 | 12/1994 | Simpson et al. ...................... | 371/22.32 |
| 5,477,493 | 12/1995 | Danbayashi .......................... | 371/22.32 |
| 5,673,276 | 9/1997 | Jarwala et al. ........................ | 371/22.32 |
| 5,706,297 | 1/1998 | Jeppensen, III et al. ............. | 371/22.32 |
| 5,768,289 | 6/1998 | James ................................... | 371/22.32 |

FOREIGN PATENT DOCUMENTS

| | | |
|---|---|---|
| 61-144800 | 7/1986 | Japan . |
| 6-66244 | 3/1993 | Japan . |
| 6-102327 | 4/1994 | Japan . |

*Primary Examiner*—Trinh L. Tu
*Attorney, Agent, or Firm*—Armstrong, Westerman Hattori, McLeland & Naughton

[57] ABSTRACT

A processing system having a testing mechanism that can read out data from a memory such as a ROM without increasing the number of logic circuits to simplify the circuit construction by utilizing the testing mechanism. The processing system includes an address register in the testing mechanism of a chip part connected to the memory in parallel with the other registers, a selector for selecting and sending out either test data from the testing mechanisms or read-out data from the memory. A control unit is further provided so as to set a leading address of the data to be read out from the memory to the address register by the shift operation, to switch the selector to send out the read-out data from the memory, and then, to count up the address of the address register in accordance with a data number to read out, and to read out the data from the memory. This processing system can be applied to a system having the testing mechanism of a JTAG circuit and the like.

6 Claims, 10 Drawing Sheets

FIG. 3

| | | |
|---|---|---|
| S01 | TEST-LOGIC-RESET | |
| S02 | RUN-TEST/IDLE | |
| S03 | SELECT-DR-SCAN | |
| S04 | SELECT-IR-SCAN | |
| S05 | CAPTURE-IR-SCAN | |
| S06 | SHIFT-IR(REPEAT FOR 8 BITS) | SET IR CODE "EEPROM ADRS REG" TO THE INSTRUCTION REGISTER |
| S07 | EXIT1-IR | EXECUTE AS MANY TIMES AS [NUMBER OF TOTAL LSIS-1] |
| S08 | PAUSE-IR | |
| S09 | EXIT2-IR | |
| S10 | SHIFT-IR(REPEAT FOR 8 BITS) | |
| S11 | EXIT1-IR | |
| S12 | UPDATE-IR | |
| S13 | SELECT-DR-SCAN | |
| S14 | CAPTURE-DR-SCAN | |
| S15 | SHIFT-DR(REPEAT FOR 32 BITS) | SHIFT THE ADDRESS DATA THERE IN EXECUTE $N_1$ TIMES |
| S16 | EXIT1-DR | |
| S17 | PAUSE-DR | |
| S18 | EXIT2-DR | |
| S19 | SHIFT-DR(REPEAT FOR $N_2$ BITS) | |
| S20 | EXIT1-DR | |
| S21 | UPDATE-DR | |
| S22 | RUN-TEST/IDLE | |

$N_1 = [($ADDRESS REGISTER LENGTH $+$ NUMBER OF TOTAL LSIS$-1+32)/32]$ $N_2 = ($ADDRESS REGISTER LENGTH $+$ NUMBER OF TOTAL LSIS$-1+32)-32 \times N_1$

F I G. 4

S31 TEST-LOGIC-RESET
S32 RUN-TEST/IDLE
S33 SELECT-DR-SCAN
S34 SELECT-IR-SCAN
S35 CAPTURE-IR-SCAN
S36 SHIFT-IR(REPEAT FOR 8 BITS) ⎫
S37 EXIT1-IR                    ⎪
S38 PAUSE-IR                    ⎬ EXECUTE AS MENY TIMES AS TOTAL NUMBER THE LSIS-1  ⎫
S39 EXIT2-IR                    ⎪                                                   ⎬ SET IR CODE FOR READING OUT THE EEPROM TO THE INSTRUCTION REGISTER
S40 SHIFT-IR(REPEAT FOR 8 BITS) ⎪                                                   ⎪
S41 EXIT1-IR                    ⎭                                                   ⎭
S42 UPDATE-IR
S43 SELECT-DR-SCAN
S44 CAPTURE-DR-SCAN
S45 SHIFT-DR(REPEAT FOR 32 BITS) ⎫
S46 EXIT1-DR                     ⎪
S47 PAUSE-DR                     ⎬ EXECUTE $N_3$ TIMES ⎫
S48 EXIT2-DR                     ⎪                     ⎬ READ OUT DATA FROM THE EEPROM
S49 SHIFT-DR(REPEAT FOR $N_4$ BITS) ⎪                  ⎪
S50 EXIT1-DR                     ⎭                     ⎭
S51 UPDATE-DR
S52 RUN-TEST/IDLE $N_3 = [n/32]$
$N_4 = n - 32 \times N_3$

PROCESSING SYSTEM HAVING TESTING MECHANISM

BACKGROUND OF THE INVENTION

1. Field of the Invention

The present invention relates to a processing system including a computer system having a testing mechanism (for example, a JTAG circuit as a boundary scan architecture) for testing a high-density printed circuit board, particularly to a technique for reading out data from a memory such as a ROM by using the testing mechanism.

2. Description of the Related Art

High-density integration in chip parts including LSIs has eagerly been sought in recent years and more complicated circuits can be mounted on a smaller chip. The surface mounting technique on a printed circuit board has also advanced so that more chips can be mounted on the printed circuit board. Owing to the advancement of these fields, a higher-performance system can be built up in a smaller size; on the other hand, it has become difficult to test chip parts on such a printed circuit board.

Accordingly, to test such a high-density printed circuit board, JTAG (Joint Test Action Group) has proposed aboard testing technique (test simplifying technique) as a standard of IEEE standard 1149.1. In this board testing technique, a boundary scan architecture (hereafter, referred to as JTAG circuit) is defined as a testing mechanism incorporated into chip parts including LSIs.

In this JTAG circuit (also mentioned as JTAG scan circuit), shift-type scan chains are provided with input and output pins of chip parts mounted on a printed circuit board and the scan chains for the chip parts are connected on the printed circuit board. Thereby, the state of the input and output pins can be controlled and observed only by the scan shift operation without directly probing the input and output pins of the chip parts on the printed circuit board.

A general circuit construction of the JTAG circuit will be described with reference to FIG. 6. The circuit is comprised of five tap access ports (hereafter referred to as TAP for abbreviation) 501~505 as described later, a TAP controller 51, a data register group 52, an instruction register (IR) 53, a data register selector 54 output selecting circuit 55 and a gate circuit 56.

The TAP 501 is an input terminal to receive a test clock signal TCK, and the TAP 502 is an input terminal to receive a test mode selecting signal TMS. The TAP 503 is an input terminal to receive data necessary for testing, this TAP 503 is hereafter noted as a test data input TDI. The TAP 504 is an output terminal to supply a test result of an LSI (chip) provided with the JTAG circuit, this TAP 504 is hereafter noted as a test data output TDO. Furthermore, the TAP 505 is to receive a test reset signal TRST to initialize test logic in the JATG circuit.

The TAP controller 51 controls, by means of the test mode selecting signal TMS and the test clock signal TCK, the shift operation whereby the input data from the test data input TDI is sent to the instruction register 53 or to the data register group 52. Furthermore, this TAP controller 51 controls the register selecting operation by the output selecting circuit 55 and the gate operation by the gate circuit 56.

The data register group 52 consists of a user test data register 520, boundary scan register 521, and bypass register 522.

The user test data register 520 stores an arbitrary test data that a user individually determines, and is composed of shift registers. The boundary scan register 521 is composed of one stage shift registers provided in correspondence with terminals of the part (here, an LSI) to be tested, and captures or holds signals appearing on the terminals of the LSI on the basis of the theory of the scan test The bypass register 522 is composed of one stage shift registers, and it enables the input data from the test data input TDI to bypass the circuit between the test data input TDI and the output selecting circuit 55 so that the input data can go through the circuit as it is from the test data output TDO. Therefore, this bypass register 522 is used when bypassing data from this JTAG circuit to the other JTAG circuit on the subsequent stage.

On the other hand, the instruction register 53 writes a command (register designating command) from the test data input TDI by the shift operation.

The data register selector 54 analyzes the command written in the instruction register 53, and selects the register specified by the command out of the data register group 52. The data are written into the register selected by this data register selector 54 by the shift operation When either the boundary scan register 521 or user test data register 520 is selected, the data are written; when the bypass register 522 is selected, the bypassing operation mentioned above is done by the bypass register 522.

The output selecting circuit 55 is composed of a multiplexer (MUX) 551 and 552.

The multiplexer 551 is controlled by the TAP controller 51 to select one of the registers 520~522 of the data register group 52, and sends out data of the selected register.

The multiplexer 552 is controlled by the TAP controller 51 to select either the data from the data register group 52 (the output from the multiplexer 551) or the data from the instruction register 53, and sends out the selected data.

The gate circuit 56 is controlled by the TAP controller 51 to open or close, and when the gate circuit 56 opens, sends out the data from output selecting circuit 55 (the data from the multiplexer 552) to the test data output TDO.

The JTAG circuit thus constructed is usually applied to the test of a printed circuit board containing chip parts into which the JTAG circuit is integrated. However in recent years, it has been done to set data during a test or normal operation in a circuit such as a register in a system logic circuit (data loading), or to read out data from a circuit such as a register in a system logic circuit (data sensing). The access command issued to a system logic circuit by using the JTAG circuit is called the JTAG command.

In the JTAG circuit performing a data loading or data sensing by the JTAG command, as shown in FIG. 7, a JTAG instruction register (hereafter, abbreviated as JIR) 523 and a JTAG data register (hereafter, abbreviated as JDR) 524 are provided in replacement of the user test data register 520 shown in FIG. 6.

The JIR 523 functions as a storage of the command for controlling the system logic circuit in this LSI and consists of shift registers (or, shift registers and latch circuits), and sequentially shifts and receives the input data from the test data input TDI. When a specific command is set in this JIR 523, the command in the JIR 523 is transferred into a command analyzing unit in the command control unit (not illustrated), and the command is analyzed therein.

The JDR 524 functions as a storage of the data to be written into the system logic circuit in this LSI and the data read out from the system logic circuit in this LSI, and consists of shift registers (or, shift registers and latch circuits) in the same manner as the JIR 523.

When the data are written into this JDR 524, the input data from the test data input TDI are sequentially shifted and received. When specific data are set, the data in the JDR 524 are transferred to a processing unit in the foregoing command controlling unit, and a process is executed on the basis of an analyzed result by the foregoing command analyzing unit. It is possible, for example, to set data in the register of the system logic circuit performing a normal operation, to set a specific value to a counter, or to reset only a specific circuit in this LSI.

On the contrary, it is possible to read out the data of the system logic circuit performing a normal operation from the test data output TDO through the JDR 524. Namely, the data set in the register in the system logic circuit are transferred to the JDR 524, the data of the JDR 524 are sequentially shifted, and thereby, the shifted data are sent out from the test data output TDO.

The data-write into the JIR 523 or JDR 524 is done, as described above, with a shift operation when the data register selector 54 selects the JIR 523 or JDR 524.

Next, the operation of the JTAG circuit (executing operation of the JTAG command) comprising the JIR 523 and JDR 524 will be described with reference to FIG. 8. FIG. 8 is a flow chart showing a state transition of the test logic. The state transition of the test logic is controlled by the TAP controller 51 to embody various test states The TAP controller 51 is controlled by the test clock signal TCK, test mode selecting signal TMS, and test reset signal TRST entering from the TAP 501, 502, and 505, respectively Immediately after initialized, the TAP controller 51 is in the TEST-LOGIC-RESET state (S201). In this state, the test logic is unavailable, and the normal operation of the system logic is 15 possible.

Each of the states is transferred in accordance with the state of the test mode selecting signal TMS when the test clock signal TCK rises When the state is in the TEST-LOGIC-RESET state (S201), for example, the test clock signal TCK rises, and if the test mode selecting signal TMS at that moment is "0", the state is transferred to the RUN-TEST/IDLE state (S202); if the test mode selecting signal TMS at that moment is "1", the state is held in the TEST-LOGIC-RESET state (S201).

The RUN-TEST/IDLE state (S202) is the basic state during a test being executed, which is a state that a scan operation is about to start, or an intermediate state during the scan operation When the state is transferred to the SELECT-DR-SCAN state (S203), the scan sequence is initialized.

Next, the state is transferred into the CAPTURE-DR state (S211) or into the SELECT-IR-SCAN state (S204) in accordance with the state of the test mode selecting signal TMS. Here, the transition to the SELECT-IR-SCAN state (S204) to perform a scan operation to the instruction register 53 will be described. When the state is transferred to the SELECT-IR-SCAN state (S204), the scan sequence of the instruction register 53 is initialized.

When the state is transferred to the CAPTURE-IR state (S205), a fixed pattern is captured in the shift registers forming the instruction register 53. This fixed pattern has a fixed binary code "01" in the lower two bits, and an information intrinsic to a design can be incorporated into this pattern. The data of the instruction register 53 can be read out through the test data output TDO while shifting the data.

When the state is transferred to the SHIFT-IR state (S206), the shift registers forming the instruction register 53 are connected to the test data input TDI and the test data output TDO. When the test mode selecting signal TMS is "0", and every time the test clock signal TCK rises, the data are shifted toward the test data output TDO. If the instruction register 53 is constituted with 8 bits, repeating the shift operation eight times enables specific data to be written into the instruction register 53. Furthermore, sending out the data of the instruction register 53 to the test data output TDO while repeating the shift operation enables the data of the instruction register 53 to be read out.

When the shift operation finishes, the state is transferred to the EXIT1-IR state (S207) to end the scan operation. In this EXIT1-IR state (S207), setting the test mode selecting signal TMS to "0" and rising the test clock signal TCK transfers the state to the PAUSE-IR state (S208); setting the test mode selecting signal TMS to "1" and rising the test clock signal TCK transfers the state to the UPDATE-IR state (S210).

When the state is transferred to the PAUSE-IR state (S208), the shift operation of the instruction register 53 is paused in a serial pass between the test data input TDI and the test data output TDO. This state is utilized when a new pattern is loaded into an internal memory from an external memory.

In the PAUSE-IR state (S208), setting the test mode selecting signal TMS to "1" and rising the test clock signal TCK transfers the state to the EXIT2-IR state (S209) to stop the scan. When the scan operation is further needed, in the EXIT2-IR state (S209), setting the test mode selecting signal TMS to "0" and rising the test clock signal TCK transfers the state again to the SHIFT-IR state (S206) to perform the shift operation. when ending the scan operation, in the EXIT2-IR state (S209), setting the test mode selecting signal TMS to "1" transfers the state to the next UPDATE-IR state (S210).

When the state is transferred to the UPDATE-IR state (S210), new instruction data shifted to the shift registers are latched to be sent out in parallel When all the data are completely latched, execution of the instruction starts.

If a bypass instruction is loaded, for example, into the instruction register 53, the bypass register 522 is selected and is connected to the test data input TDI and the test data output TDO so as to bypass the data by the shift operation.

If an instruction "JIR SET" or "JDR SET" is loaded into the instruction register 53, the JIR 523 or JDR 524 is selected and is connected to the test data input TDI and the test data output TDO so as to execute the data loading into the JIR 523 or JDR 524 and the data sensing from the JIR 523 or JDR 524, namely, the data scanning by the sift operation.

On the other hand, the state S203 and S211 through S216 in FIG. 8 shows the state in which the scan operation is executed to the boundary scan register 521, bypass register 522, JIR 523, or JDR 524.

When comparing the scan operation by the state S203 and S211 through S216 with the scan operation to the instruction register 53 described in the state S204 through S210, there are differences in the two points: (a) the registers to be scanned are four registers 521 through 524 of the data register group 52 against the instruction register 53; (b) the number of shifting in the scan operation is varied depending on which one of the registers 521 through 524 is selected to be scanned.

However, the state transition is substantially the same, the state S203 and the S211 through S216 correspond to the state S204 through S210, respectively, and the description will be omitted.

In the denotation of the state S204 through S210, "IR" meaning the instruction register 53 is changed into "DR" meaning the data register 52 in the denotation of the state S203 and the S211 through S216, which is a difference in the notation.

FIG. 9 illustrates a total construction of a processing system (computer system) employing chip parts into which the JTAG circuit described above with FIGS. 7 and 8 is incorporated. The processing system is comprised of a service processor (hereunder, abbreviated as SVP) 101, an interface circuit [hereunder, abbreviated as SCI(System Console Interface)] 102, and a mother board 103.

The SVP 101 is connected to the mother board 103 through the SCI 102 to control the maintenance and operation of the total system. The SVP 101 issues commands to control: the registers in the printed circuit boards 103-1 through 103-m constituting the mother board 103, a data-write into a memory, and a data read-out from a memory.

The chip parts such as LSIs mounted on the printed circuit boards 103-1 through 103-m are provided with the JTAG circuits described in FIG. 7. The SVP 101 also controls the JTAG circuits through the SCI 102. Accordingly, the SCI 102 and the printed circuit boards 103-1 through 103-m in the mother board 103 are connected by signal lines 104 to transmit and receive commands and data so as to control the JTAG circuits.

Incidentally, the conventional computer system has been trying to improve the performance of the central processing unit (CPU) itself in order to cope with users' needs. However, with this approach alone, the increasing users' needs cannot be satisfied in some aspects, and recently, the parallel processing computer has attracted a considerable attention.

The parallel processing computer constitutes one computer system in which several to some hundreds of processing units called processor element (PE) are connected to be able to communicate each other, and the PEs each can execute the processes, thereby improving performance as a system by executing the parallel processes.

The units constituting such a computer system each are composed of a plurality of printed circuit boards as shown in FIG. 9. The printed circuit boards each are provided with a clock signal from a clock oscillator, and a plurality of the printed circuit boards operate synchronously with the clock signal. However, the printed circuit boards each have intrinsic characteristics of their own, and generally, the circuit boards having an identical circuit construction will have deviations in the operational timing among the printed circuit boards.

In order to annul the deviations in the timing, clock tuning latches are provided on each of the printed circuit boards. Setting specific clock tuning data according to the characteristics of the printed circuit boards to the corresponding latches and making the clock timing to coincide with each other among the printed circuit boards will annul the deviation in the timing so that the total unit can operate synchronously with one clock.

The process to set specific clock tuning data to clock tuning latches is called a clock tuning process. Generally, this clock tuning process is done for a start-up period of the system from the moment the system is powered to the start of the operation, as follows.

In the units constituting the computer system, continuously connecting the clock tuning latches on the printed circuit boards forms one loop (tuning scan loop), and sending the clock tuning data to be set to the latches into the foregoing loop sequentially according to the sequence to connect the latches and repeating the shift loads the clock tuning data into the specific latch. The clock tuning data and the data intrinsic to the printed circuit boards which are necessary for the start-up of the system, and others are stored in advance in an EEPROM described later in FIG. 10 or the like, and are read out from the EEPROM or the like at the start-up.

Next, FIG. 10 illustrates a construction of important parts of the processing system that performs the foregoing clock tuning process. The processing system shown in FIG. 10 is virtually identical to the processing system shown in FIG. 9. FIG. 10 further illustrates a detailed construction of the printed circuit board 103-x functioning as an MCU (Main Control Unit) of a plurality of the printed circuit boards constituting the mother board 103 and a detailed construction of the SCI 102.

As shown in FIG. 10, the printed circuit board 103-x includes three LSI-1, LSI-2, and LSI-3, each of which is provided with the JTAG circuit as a JTAG testing unit 100 as described in FIG. 6 or 7. Connecting these JTAG testing units 100 in a chain forms a round scan chain in the printed circuit board 103-x. And, the SCI 102 is provided with a JTAG control unit 104 that controls the JTAG testing units 100 namely, writes desired data into the registers (refer to FIG. 7) of the JTAG testing units 100.

Furthermore, the system shown in FIG. 10 is provided with an EEPROM (nonvolatile memory) 105 of, for example, 8 Kbytes connected to the LSI-2 in the printed circuit board 103-x functioning as an MCU. This EEPROM 105 holds the clock tuning data of the printed circuit boards constituting the mother board 103, and the other data necessary for the start-up of the system that are intrinsic to the printed circuit boards.

At the start-up of the processing system, the data stored in the EEPROM 105 needed to be read out in order to execute the foregoing clock tuning process. Accordingly, the processing system shown in FIG. 10 is provided with, apart from the aforementioned JTAG testing units 100 and the JTAG control unit 104, a data load unit 106, EEPROM read-out control unit 107, and data transfer unit 108 on the SCI 102, and is provided with an address write unit 109 and address register (ADRS) 110 on the LSI-2 connected to the EEPROM 105.

The data load unit 106 receives data read-out designating data as well as address data (leading address, read-out data number) at the start-up of the processing system from the SVP 101, and sends the leading address of the data to be read out to the 20 address write unit 109 in the LSI-2 of the printed circuit board 103-x.

The address write unit 109 sets the leading address from the data load unit 106 to the address register 110, and the data in an address set in the address register 110 are read out from the EEPROM 105 to the EEPROM read-out control unit 107.

The EEPROM read-out control unit 107 sends out a count-up designation [address-up (AD UP)signal] to the address register 110 in order to count up the address set to the address register 110 one by one for the read-out data number from the leading address, and on the other hand sends out the data read out from the EEPROM 105 to the data transfer unit 108. The data transfer unit 108 transfers the data read out from the EEPROM 105 to a memory (DM) 111 for a DMA (Direct Memory Access) of the SVP 101.

According to the foregoing construction at the start-up of the processing system, the read-out designation such as the clock tuning data as well as the address data (leading address, read-out data number) are sent out to the data load unit 106 of the SCI 102 from the SVP 101. The leading address of the address data is sent out from the data load unit 106 through the address write unit 109 to be set to the address register 110 in the LSI-2.

The data in accordance with the address set to the address register 110 are read out from the EEPROM 105, and the read-out data are transferred to the DM 111 of the SVP 101 through the EEPROM read-out control unit 107 and the data transfer unit 108. The address set to the address register 110 is counted up one by one for the read-out data number from the leading address by the EEPROM read-out control unit 107, and the data such as the clock tuning data requested by the SVP 101 are sequentially read out from the EEPROM 105 into the SVP 101. And, the SVP 101 executes the initialization of the clock tuning process and the like using the read out data.

However, the processing system shown in FIG. 10 has to be provided with a single-purpose circuit as a mechanism to read out the clock tuning data and the like stored in the EEPROM 105, namely, the data load unit 106, EEPROM read-out control unit 107, address write unit 109 and the like, which invites complexity of the circuit construction.

SUMMARY OF THE INVENTION

The present invention has been made in view of the foregoing problem, and it is therefore an object of the present invention to provide a processing system having a testing mechanism whereby a testing mechanism incorporated in advance is utilized to read out data from a Rom or the like without increasing logic circuits and simplify the circuit construction.

Accordingly, the processing system having a testing mechanism relating to the present invention comprises at least one printed circuit board having a plurality of chip parts thereon.

The testing mechanism for testing boards is integrated into each of the chip parts on the printed circuit board, and registers constituting the testing mechanisms are connected in a chain through a plurality of the chip parts.

A control unit is provided for writing desired data into the registers connected in a chain by means of shift operation.

A memory is further provided which is connected to at least one of a plurality of the chip parts.

An address register in which an address for designating data to be read out from the memory is set is also provided in parallel to the other registers in the testing mechanism of the chip part to which the memory is connected.

And, a selector is provided for selecting and sending out either test data read out from the testing mechanisms by the shift operation or read-out data from the memory, designated by the address of the address register.

In the processing system thus constructed, the foregoing control unit controls so as to set a leading address of the data to be read out from the memory to the address register by the shift operation, to switch the selector to send out the read-out data from the memory, and then, to count up the address of the address register in accordance with a data number to be read out, and to read out the data from the memory by means of the shift operation.

Thus, in the processing system having a testing mechanism according to the present invention, the address of data to be read out from the memory can be set by utilizing the testing mechanisms integrated in advance, and the data can be read out from the memory by means of the shift operation in the testing mechanisms; therefore, the data read-out from the memory can be done without increasing logic circuits to greatly simplify the circuit construction.

BRIEF DESCRIPTION OF THE DRAWINGS

FIG. 3 is a chart showing a state transition when a leading address is set to an address register, in the embodiment of the present invention;

FIG. 4 is a chart showing a state transition when data are read out from an EEPROM, in the embodiment of the present invention;

DESCRIPTION OF THE PREFERRED EMBODIMENT (a) Description of the Aspect of the Invention FIG. 1 is a block diagram showing the aspect of the invention. As shown in FIG. 1 the processing system 1 of the invention is provided with at least one printed circuit board 2 having a plurality of chip parts 3. Testing mechanisms 4 each are incorporated into the chip parts 3 on the printed circuit board 2, and registers 5 constituting the testing mechanisms 4 are connected in a chain through a plurality of the chip parts 3.

Figure 1:
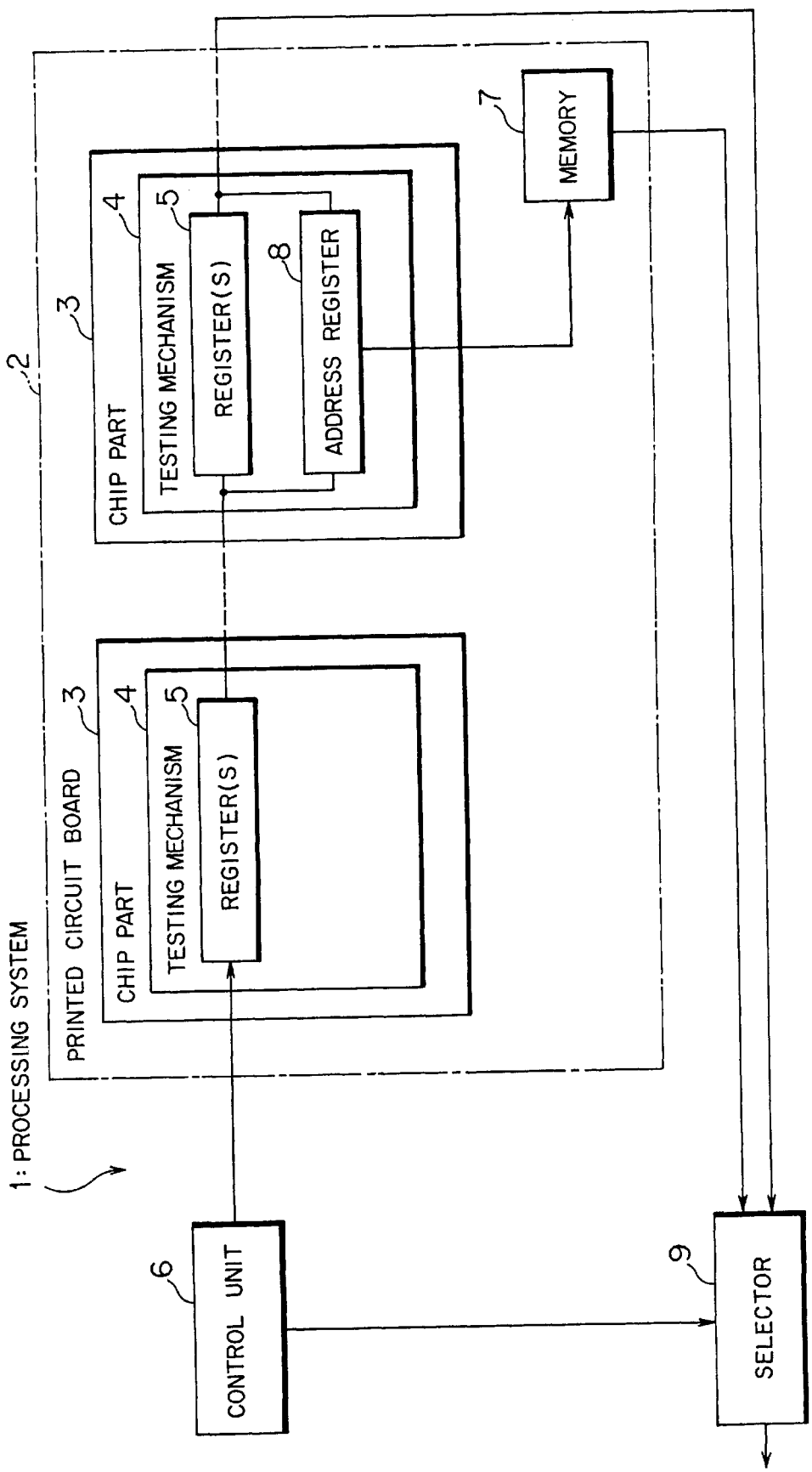
FIG. 1 is a block diagram showing an aspect of the present invention.

Furthermore, the processing system 1 is provided with a control unit 6 for writing desired data into the registers 5 connected in a chain as described above by shifting the data, and is provided with a memory 7 connected to at least one of the chip parts 3 constituting the printed circuit board 2.

Still, the processing system 1 is provided with an address register 8 in which an address for designating data to be read out from the memory 7 is set is connected in parallel to the register 5 in the testing mechanism 4 of the chip part 3 connected to the memory 7. The processing system 1 is also provided with a selector 9 for selecting and sending out either test data outputs read out from the testing mechanisms 4 by the foregoing shift operation or data read out from the memory 7 in accordance with the designated address in the address register 8.

In addition, the control unit 6 sets the leading address of the data to be read out from the memory 7 to the address register 8 by the foregoing shift operation, and switching the output of the selector 9 to send out the read-out data from the memory 7, while counting up the address in the address register 8 corresponding to the data number to be read out, controls to read out the data from the memory 7 using the foregoing shift operation.

Thereby, an address based on which the data are read out from the memory 7 can be set by utilizing the testing mechanisms 4 integrated in advance, and the data can be read out from the memory 7 using the shift operation in the testing mechanisms 4. Therefore, the data read-out from the memory 7 can be done without increasing logic circuits.

Still, the testing mechanism 4 may be formed of a boundary scan architecture, JTAG circuit, for testing boards.

In this construction, the JTAG circuit is comprised of a data register including a boundary scan register that captures and holds signals appearing on terminals of the chip parts 3 into which the JTAG circuits are integrated and a one-bit bypass register that sends out the data transferred from the testing mechanism 4 at the previous stage by the foregoing shift operation without changing anything to the testing mechanism 4 at the subsequent stage, an instruction register that stores an instruction for designating one of these registers in the data register, a data register selector for selecting the register corresponding to the instruction stored in the instruction register out of the data register, and an output data selector for sending out the data from the register selected by the data register selector.

And, the boundary scan registers, bypass registers, and instruction registers are connected through the output data selectors in a chain through a plurality of the chip parts 3. In addition, in the JTAG circuit (testing mechanism 4) in the chip part 3 connected to the memory 7, the address register 8 served as the foregoing data register is provided in parallel with the boundary scan register and the bypass register.

When data are read out from the memory 7 in this case, the control unit 6 sets a code for selecting the address register 8 to the instruction register of the JTAG circuit in the chip part 3 connected to the memory 7, sets a code for selecting the bypass register to the other instruction registers of the JTAG circuits in the chip parts 3 to which the memory 7 is not connected, and sets the leading address of the data to be read out from the memory 7 to the address register 8 by the foregoing shift operation.

Thereby, in the chip parts 3 to which the memory 7 is not connected, the bypass register sends out the leading address form the testing mechanism 4 at the previous stage to the testing mechanism 4 at the subsequent stage by means of one-bit shift operation; and therefore, the registers 5 do not need to repeat shifting the leading address, and the time required for setting the leading address to the address register 8 in the chip part 3 to which the memory 7 is connected can be reduced.

Furthermore, in the aforementioned processing system 1, a nonvolatile memory in which the clock tuning data are stored in advance may be employed for the memory 7, so that the control unit 6 can read out the clock tuning data from the nonvolatile memory (memory 7) at the start-up of the processing system 1. Thereby, the circuit construction for reading out data necessary for the clock tuning process executed at the start-up of the system can be simplified.

As described above in detail, according to the processing system 1 having the testing mechanism of the invention shown in FIG. 1, the address of the data to be read out from the memory 7 can be set by utilizing the testing mechanism 4 integrated in advance, and in addition, the data can be read out from the memory 7 by using the shift operation in the testing mechanism 4; and therefore, the data read-out from the memory 7 can be done without increasing logic circuits, thus significantly simplifying the circuit construction.

In the chip parts 3 to which the memory 7 is not connected, the leading address from the testing mechanism (JTAG circuit) 4 at the previous stage is sent out to the testing mechanism 4 at the subsequent stage by one-bit shift operation; and thereby, the registers do not need to repeat shifting the leading address. Accordingly, the time required for setting the leading address to the address register 8 can be reduced, enhancing efficiency of the data read-out process.

Still more, for the memory 7 can be applied a nonvolatile memory in which the clock tuning data are stored in advance and the clock tuning data can be read out from the nonvolatile memory at the start-up of the system; and therefore, the circuit construction for reading out data necessary for the clock tuning process executed at the start-up of the system can significantly be simplified.

(b) Description of one Embodiment of the Invention

One preferred embodiment of the invention will hereafter be described with reference to the accompanying drawings.

Figure 2:
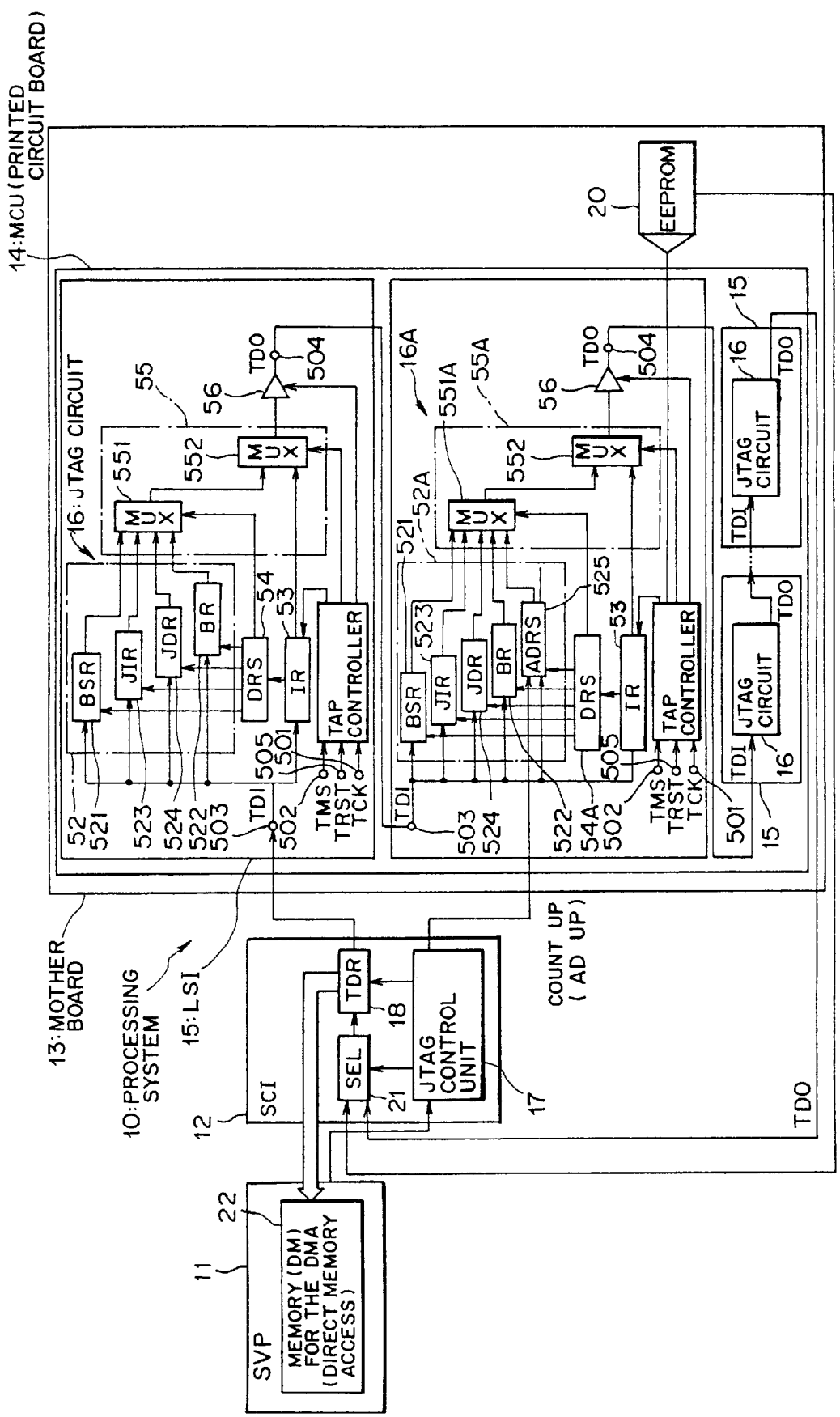
FIG. 2 is a block diagram showing a construction of the processing system having a testing mechanism (JTAG circuit) as one embodiment of the present invention.
Figure 9:
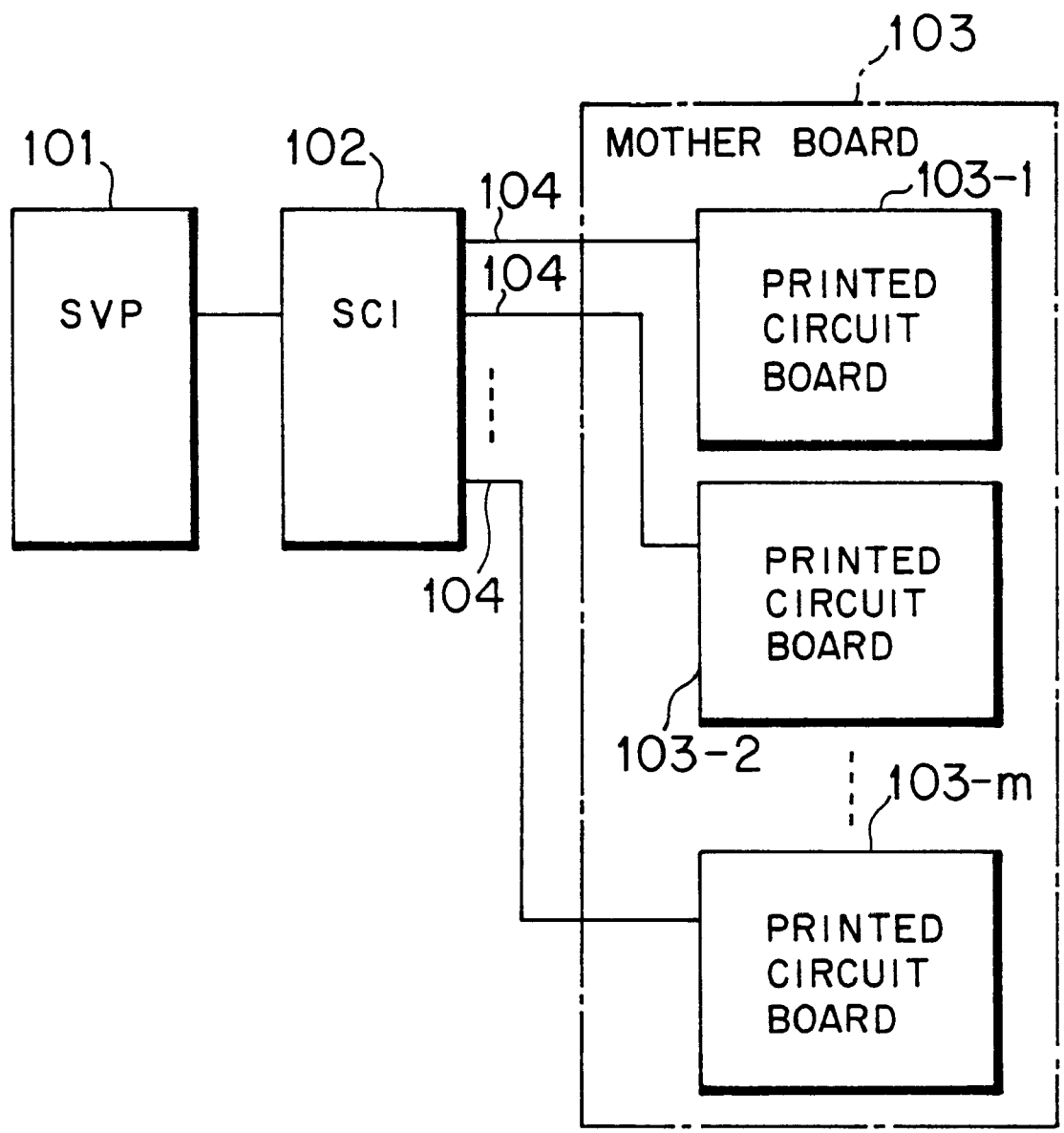
FIG. 9 is a block diagram showing a total construction of the processing system having the JTAG circuit shown in FIG. 7.
Figure 10:
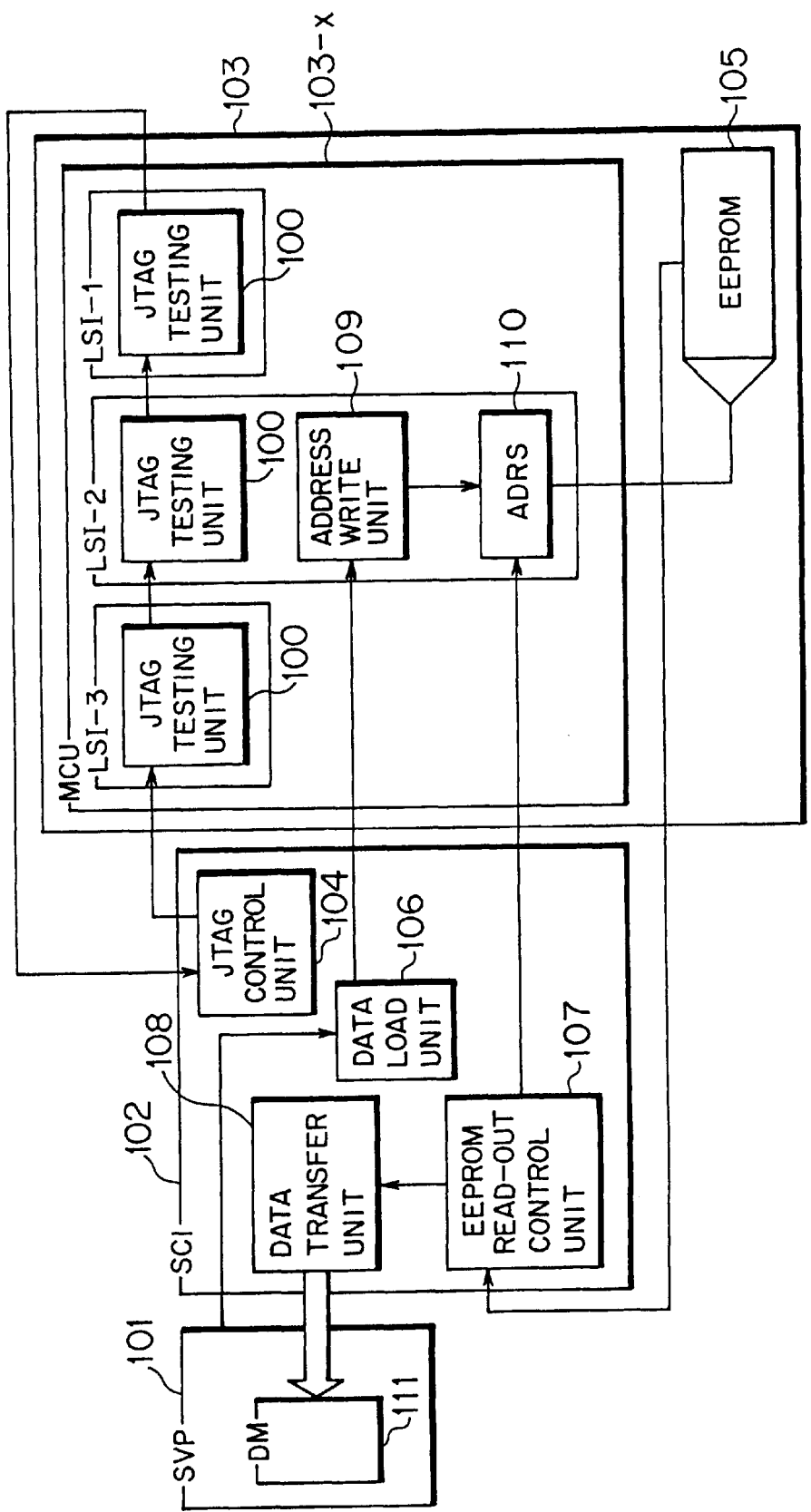
FIG. 10 is a block diagram showing a construction of important parts in a processing system that executes a clock tuning process.

FIG. 2 is a block diagram showing a construction of the processing system having a testing mechanism (JTAG circuit) of one embodiment of the invention. As shown in FIG. 2, a processing system 10 is comprised of, as virtually the same as one in FIG. 9, an SVP 11, SCI 12, and mother board 13. In FIG. 2, the same symbols as those already mentioned indicate the same parts, and the detailed description will be omitted.

The SVP 11 includes a memory (DM) 22 for the DMA (Direct Memory Access) and connects with the mother board 13 through the SCI 12. The SVP 11 performs the maintenance and operation control of the total system, and issues the control commands such as register control, data-write into the memory, and data read-out from the memory and the like in the printed circuit boards 14 constituting the mother board 13.

A plurality of LSIs (chip parts) 15, 15A mounted on the printed circuit board 14 are provided with JTAG circuits 16, 16A as a testing mechanism, respectively. The SVP 11 also controls the JTAG circuits 16, 16A through the SCI 12. Accordingly, the SCI 12 and the printed circuit board 14 in the mother board 13 are connected so as to transmit and receive the commands and data for controlling the JTAG circuits 16, 16A.

The test data outputs TDO of the JTAG circuits 16, 16A in the LSIs 15, 15A each are connected to the test data inputs TDI of the JTAG circuits 16, 16A in the other LSIs 15, 15A on the same circuit board 14. Thereby, a scan chain is formed in the printed circuit board 14 to connect each of the LSIs 15, 15A in a round chain.

To the LSI 15A in the printed circuit board 14 serving as an MCU in the mother board 13 is connected an EEPROM (nonvolatile memory) 20 having the capacity of, for example, 8 kbytes. In this EEPROM 20, the clock tuning data on the circuit boards constituting the mother board 13, the other data intrinsic to the printed circuit boards necessary for the start-up, and the like are stored in advance.

In this embodiment, an address register (ADRS) 525 is further provided in parallel to the other registers 521~524 as a data register, in which an address for designating the data to be read out from the EEPROM 20 is set to the data register group 52A of the JTAG circuit 16A in the LSI 15A connected to the EEPROM 20.

Accordingly, in the JTAG circuit 16A in this LSI 15A, the data register selector (DRS) 54A analyzes a command written in the instruction register (IR) 53, and selects a register-designated by the command out of the data register group 52A (five registers 521~525). Into this register selected by the data register selector 54A, data are written by the shift operation. The multiplexer 551A of the output selecting circuit 55A is controlled by the TAP controller 51 such that the multiplexer 551A selects one out of the five registers 521~525 in the data register group 52A and sends out the data of the selected register. The construction of the other parts in the JTAG circuit 16A is the same as those shown in FIG. 7 (JTAG circuit 16 in FIG. 2), and the description will be omitted.

Figure 7:
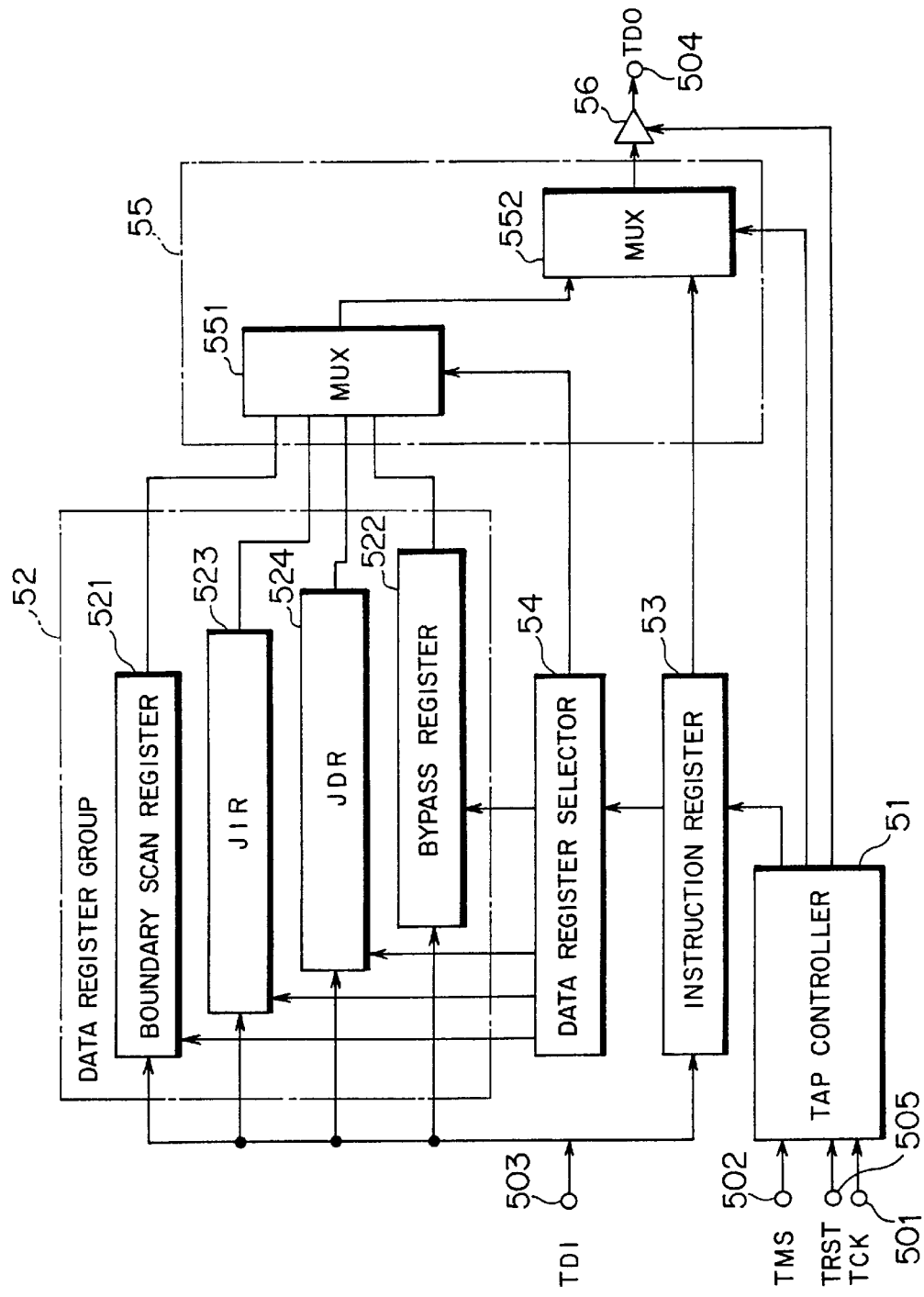
FIG. 7 is a block diagram showing a construction of the JTAG circuit having a JIR and JDR.
Figure 8:
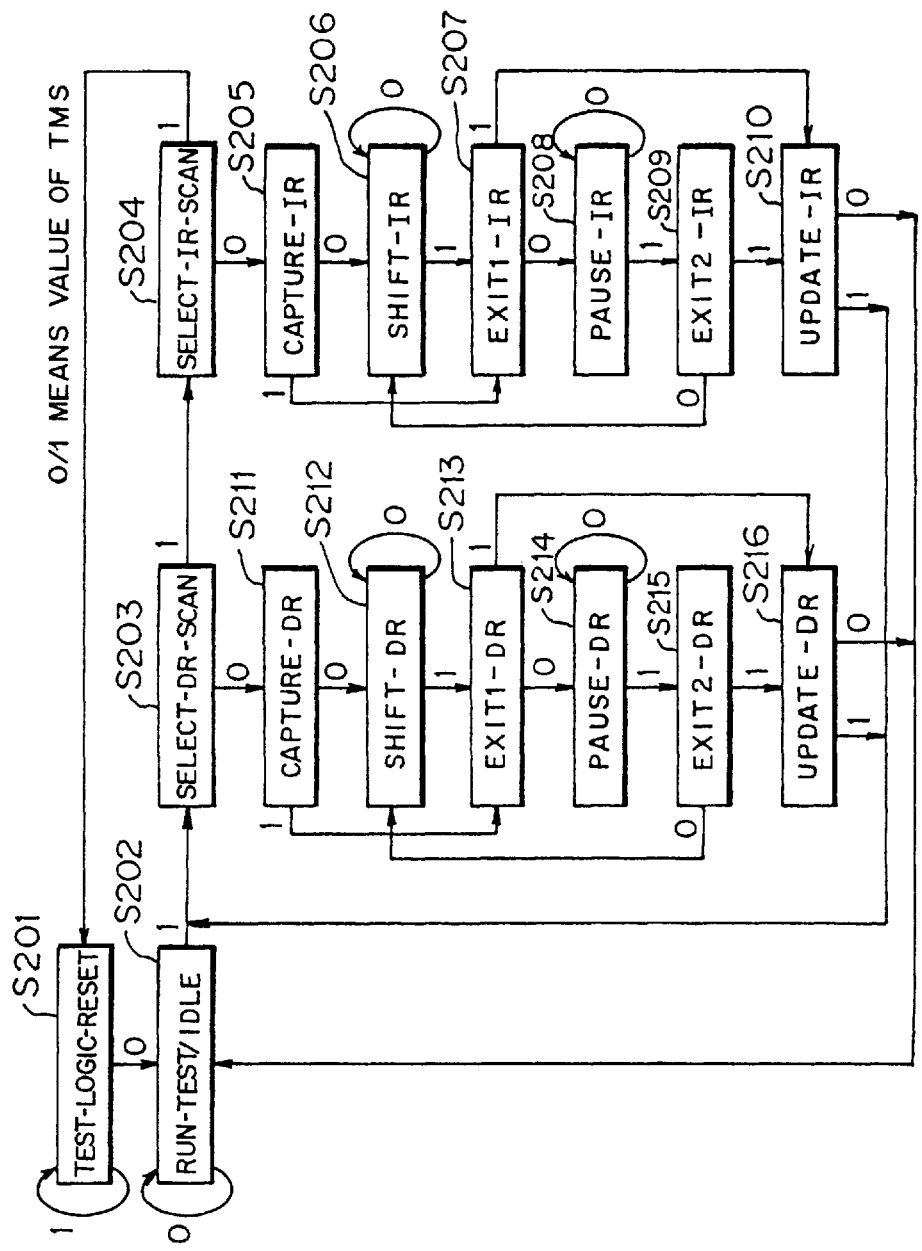
FIG. 8 is a flow chart showing a state transition of a test logic that explains the operation of the JTAG circuit shown in FIG. 7.

The JTAG circuit 16 in the LSI 15 to which the EEPROM 20 is not connected is constructed in the same manner as the one shown in FIG. 7, and the description will be omitted. And, in FIG. 2, although only the JTAG circuit 16 in the one LSI 15 is illustrated in detail, the other JTAG circuits 16 in the other LSIs 15 have the same construction, and the detailed construction is not illustrated.

Furthermore, FIG. 2 illustrates the construction that functions as an MCU (Main Control Unit) of the circuit boards 14 constituting the mother board 13. In this embodiment, the characteristic construction of this invention on the mother board 13 lies in only the circuit board (MCU) 14 to which the EEPROM 20 is provided, and the other circuit boards constituting the mother board 13 are not illustrated.

On the other hand, the SCI 12 is provided with a JTAG control unit 17, TDR (Test Data Register) 18, and SEL (Selector) 21.

Here, the JTAG control unit 17 controls the JTAG circuits 16 and 16A through the TDR 18 so as to write the commands and data by the shift operation into the registers 53 and 521 through 525 which are connected in a chain.

The selector 21 selects either the test data output TDO read out from the testing mechanisms 4 by the shift operation or the data read out from the EEPROM 20 base on the address designated by the address register 525, and sends out to the TDR 18.

At the start-up of the processing system 10, the JTAG control unit 17 receives from the SVP 11 the data read-out command with the address data (leading address and read-out data number) to the EEPROM 20. The JTAG control unit 17 sets the leading address of the data to be read out from the EEPROM 20 by the shift operation to the address register 525 of the JTAG circuit 16A in the LSI 15A. The JTAG control unit 17 further controls such that, after the selector 21 switches the output to send out the read-out data from the EEPROM 20, counts up the address of the address register 525 in accordance with the data number to be read out and reads out the data from the EEPROM 20 by means of the shift operation.

Thus, the JTAG control unit 17 in this embodiment has the functions apart from the normal function to control the JTAG circuits 16 and 16A: a function to send out the leading address designated by the SVP 11 to the TDR 18 and to write the leading address by the shift operation into the address register 525 of the JTAG circuit 16A in the LSI 15A; a function to set a code for directing the data read-out from the EEPROM 20 to the instruction register 53 of the JTAG circuit 16A in the LSI 15A and at the same time to switch the selector 21 into the side of the EEPROM 20; and a function to supply a count-up signal [AD UP (Address Up) signal] to the address register 525.

The data read out from the EEPROM 20 are transferred to the memory 22 for the DMA of the SVP 11 via the selector 21 and TDR 18.

Next, the characteristic operation in the processing system 10 of the embodiment thus constructed, that is, the data read-out operation from the EEPROM 20 will be described with reference to FIGS. 3 through 5.

In this embodiment, the clock tuning data stored in the EEPROM 20 is read out in order to execute the clock tuning process at the start-up of the processing system 10. Accordingly, at the same time to start up the processing system 10, the instruction to read out data from the EEPROM 20 is sent to the JTAG control unit 17 of the SCI 12 from the SVP 11, which includes the address data [leading address of the storage area for the clock tuning data and the number of the data (number of the read-out data, bit number)].

Receiving the data read-out instruction, first, the JTAG control unit 17 sets an IR code "EEPROM ADRS REG" for selecting the address register 525 to the instruction register 53 of the JTAG circuit 16A in the LSI 15A connected to the EEPROM 20, sets an IR code "FF" for selecting the bypass register 522 to the other instruction registers 53 of the JTAG circuits 16 in the other LSIs 15 to which the EEPROM 20 is not connected, and thereafter, shifts the address data (leading address of the read-out data area) therein.

FIG. 3 illustrates a state transition when the foregoing address data are set.

In FIG. 3, S04 through S12 shows a state transition in which the IR code for selecting the address register 525 is set to the instruction register 53 of the LSI 15A and the IR code for selecting the bypass register 522 is set to the other instruction registers 53 of the other LSIs 15.

First, setting the test mode selecting signal TMS to "0" to start up the test clock signal TCK transfers the state from TEST-LOGIC-RESET (S01) to RUN-TEST/IDLE (S02). The state transition will hereafter be assumed to be executed in accordance with the state of the test mode selecting signal TMS at the start-up of the test clock signal TCK.

When the state transfers from RUN-TEST/IDLE (S02) through SELECT-DR-SCAN (S03) to SELECT-IR-SCAN (S04) the scan sequence of the instruction register 53 is initialized.

When the state transfers to CAPTURE-IR-SCAN (S05) a fixed pattern is captured into the shift register inside the instruction register 53, however, this fixed pattern is not used at this state.

When the state transfers to SHIFT-IR (S06), the shift registers constituting the instruction register 53 are connected to the test data input TDI and the test data output TDO, and the data are shifted toward the test data output TDO. Here, the IR code is designed to be 8 bits and the instruction register 53 to be a 8-bit shift register Accordingly, repeating shifting eight times can set an instruction to one instruction register 53 of the LSI 15 or LSI 15A.

Thereafter, the state transfers to EXIT1-IR (S07), through PAUSE-IR (S08) and EXIT2-IR (S09), returns to SHIFT-IR (S06). Such a state transition S06 through S09 is executed as many times as [number of chips (number of the LSIs 15 and 15A connected in a chain)−1], and then the state transfers to SHIFT-IR (S10) to shift eight times, and transfers to UPDATE-IR (S12) via EXIT1-IR (S11).

By the operation described above, the IR code for selecting the address register 525 is set to the instruction register 53 of the LSI 15A, and the IR code for selecting the bypass register 522 is set to the other instruction registers 53 of the other LSIs 15. Therefore, in the JTAG circuit 16A of the LSI 15A, the address register 525 in the data register group 52A is selected, and this address register 525 is connected to the test data input TDI and the test data output TDO. On the other hand, in the JTAG circuits 16 of the LSIs 15, the bypass registers 522 in the data register groups 52 are selected, and these bypass registers 522 are connected to the test data inputs TDI and the test data outputs TDO.

In the state that the IR code is thus set, the address data (leading address of the read-out data area) are shifted therein In FIG. 3, S13 through S21 shows a state transition in which the address data "ADRS DATA" are set to the address register 525 of the LSI 15A.

When the state transfers to SHIFT-DR (S15) through SELECT-DR-SCAN (S13) and CAPTURE-DR-SCAN (S14), data are shifted toward the test data output TDO bit by bit every time the test clock signal TCK rises. Since data exchange between the SVP 11 and the SCI 12 is executed on the basis of one unit consisting of 32 bits, one operation unit is specified as shift operations of 32 times, and the shift is done 32 times at the state SHIFT-DR (S15).

Thereafter, the state transfers to EXIT1-DR (S16), and returns to SHIFT-DR (S15) through PAUSE-DR (S17) and EXIT2-DR (S18). Such a state transition S15 through 518 is executed N1 times (described later), and then the state transfers to SHIFT-DR (S19) to shift N2 times (described later). And, after transferring to UPDATE-DR (S21) via EXIT1-DR (S20), the state transfers to RUN-TEST/IDLE (S22).

When the address data are shifted to the address register 525, since the check code (32 bits) goes around the scan chain synchronously with the shift operation in this embodiment, the frequency of the shift operation to be executed in the state S13 through S21 shown in FIG. 3 becomes the sum of the length of the address register 525, the number of the LSIs 15 (number of the total LSIs−1) that selects the bypass registers 522, the bit number of the check code (32). Therefore, the aforementioned frequency N1 and N2 are given by the following equations (1) and (2).

$$N1=[(\text{address register length}+\text{number of total LSIs}-1+32)/32] \quad (1)$$

$$N2=(\text{address register length}+\text{number of total LSIs}-1+32) -32\times N1 \quad (2)$$

Here, [X] means the maximum integer not exceeding X. If the length of the address register 525 is 32 bits and the total number of the LSIs is 8, the shift frequency to be executed in the state S13 through S21 shown in FIG. 3 is 32+8−1+32 =71, the frequency N1 of the state S15 through S18 to be executed is 2, and the shift frequency N2 at the SHIFT-DR state (S19) is 7.

The JTAG control unit 17 writes the address data into the address register 525 of the LSI 15A in the aforementioned manner Then, the JTAG control unit 17 sets the IR code (IR code for reading out the EEPROM) for directing the data read-out from the EEPROM 20 to the instruction register 53 of the JTAG circuit 16A in the LSI 15A connected to the EEPROM 20, as well as sets an NOP code "00" to the instruction registers 53 of the JTAG circuits 16 in the other LSIs 15 to which the EEPROM 20 is not connected.

At the same time as setting the IR code for reading out the EEPROM, the JTAG control unit 17 switches the selector 21 into the side of the EEPROM 20, further supplies the count-up signal (AD UP signal) to the address register 525 to increase the data of the address register 525, and shifts the data of the EEPROM 20 for 32 bits each through the selector 21 to the TDR 18, thus transferring the data to the memory 22 for the DMA of the SVP 11.

FIG. 4 illustrates a state transition in which the data are read out from the EEPROM.

In FIG. 4, the state S31 through S42 corresponds to the state S01 through S12 as shown in FIG. 3, and in the same procedure as shown in FIG. 3, sets the IR code for reading out the EEPROM to the instruction register 53 of the LSI 15A as well as sets the NOP code to the instruction registers 53 of the other LSIs 15.

In the state that the IR code is set as described above, the data read-out from the EEPROM 20 starts. As shown in FIG. 5, while the data of the address register 525 are increased by the count-up signal (AD UP signal), the data of the EEPROM 20 are shifted to the TDR 18 for 32 bits each. The state S43 through S51 shown in FIG. 4 shows a state transition in which the data of the designated data number (bit number) are read out from the EEPROM 20.

Figure 5:
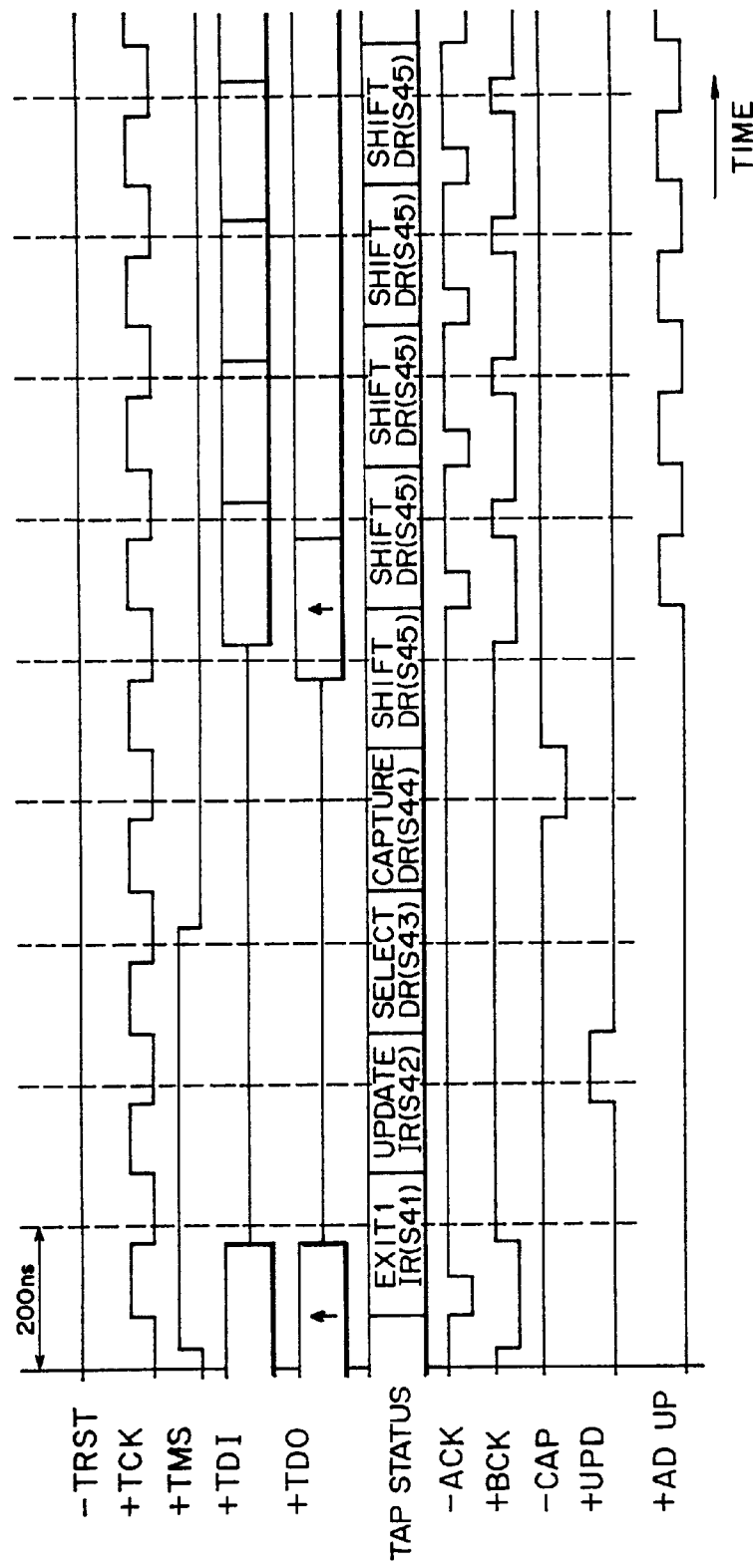
FIG. 5 is a time chart for explaining the operation of the embodiment.

When the state transfers via SELECT-DR-SCAN (S43) and CAPTURE-DR-SCAN (S44) to SHIFT-DR (S45), as shown in FIG. 5, the data of the address register 525 are increased synchronously with the test clock signal TCK by the count-up signal (AD UP signal), and the data designated by the data of the address register 525 are shifted bit by bit to the TDR 18. As described above, since the data exchange between the SVP 11 and SCI 12 is executed for one unit of 32 bits, the shift operation of 32 times is counted as one operation unit, and the shift operation is performed 32 times at SHIFT-DR (S45).

Thereafter, the state transfers to EXIT1-DR (S46) and returns to SHIFT-DR (S45) via PAUSE-DR (S47) and EXIT2-DR (S48). Thus, the state S45 through S48 is executed N3 times (described later), and then the state transfers to SHIFT-DR (S49) to execute the shift operation therein N4 times (described later), and after transferring to UPDATE-DR (S51) through EXIT1-DR (S50) the state transfers to RUN-TEST/IDLE (S52).

If the number (bit number) of data to be read out from the EEPROM 20 is n, the foregoing frequency N3 and N4 are given the following equations (3) and (4).

$$N3=[n/32] \quad (3)$$

$$N4=n-32\times N3 \quad (4)$$

Here, [X] means the maximum integer not exceeding X. If the number n of data to be read out from the EEPROM 20 is 100, naturally the shift frequency to be executed in the state S43 through S51 shown in FIG. 4 is 100, the frequency N3 of the state S45 through S48 to be executed is 3, and the shift frequency N4 at the SHIFT-DR sate (S49) is 4.

Here, since the NOP code is set to the instruction registers 53 of the other LSIs 15 to which the EEPROM 20 is not connected, any processes are not executed in the LSIs 15.

According to the embodiment of the invention, the address of the data to be read out from the EEPROM 20 can be set by utilizing the JTAG circuits 16, 16A integrated in advance, and further data can be read out from the EEPROM 20 using the shift operation in the JTAG circuits 16, 16A; therefore, the data read-out from the EEPROM 20 can be done without increasing logic circuits, and the circuit construction to read out the data required for the clock tuning process can be greatly simplified.

In the LSIs 15 to which the EEPROM 20 is not connected, selecting the bypass registers 522 can send out the leading address from the previous stage JTAG circuit 16 to the subsequent stage JTAG circuit 16 (or 16A) only by one-bit shift operation; therefore, repeating to shift the leading address on the registers becomes needless, and the time required for setting the leading address to the address register 525 can be shortened, thus enhancing efficiency of the data read-out process.

In the foregoing embodiment, the memory is the EEPROM 20 in which the clock tuning data are stored in advance. However, the invention is not limited to this, and a memory such as ROM in which the other data are stored can be applied for the memory, thereby the similar function and effect to the foregoing embodiment can be achieved.

Further, in the foregoing embodiment, the chip parts are LSIs, however, the invention is not limited to this.

Figure 6:
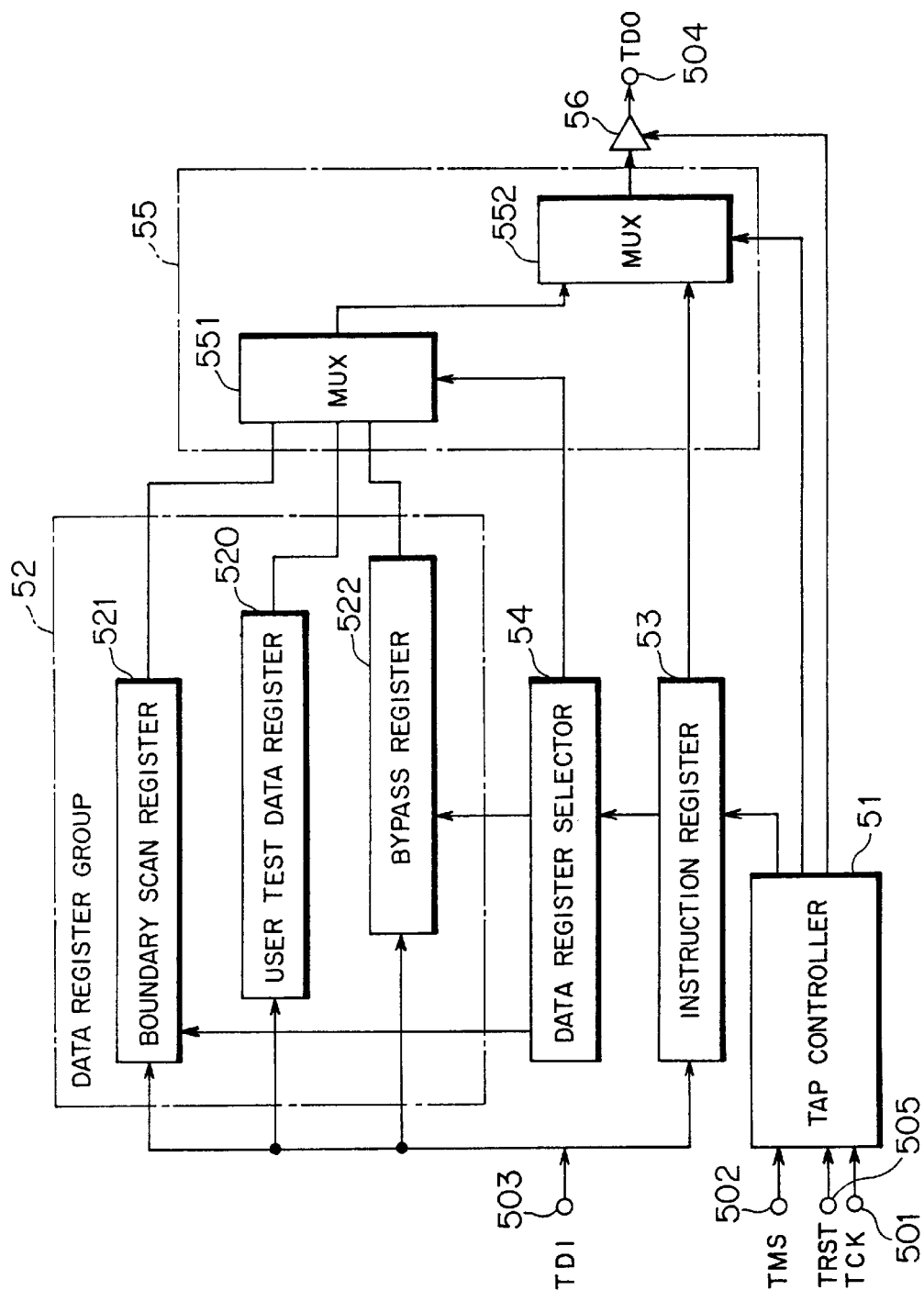
FIG. 6 is a block diagram showing a general construction of the JTAG circuit.

Still more, in the foregoing embodiment, the testing mechanism is provided with the JTAG circuit having the JIR 523 and the JDR 524, as shown in FIGS. 2 and 7. However, the invention is not limited to this, for example, a circuit in which the JTAG circuit as shown in FIG. 6 is integrated into the chip parts (LSI 15, 15A) can be applied in the same manner as the foregoing embodiment, and can achieve the similar function and effect.

While the specific embodiments of the present invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A processing system in which at least one board composed of a plurality of chip parts is provided, the processing system comprising:

a plurality of testing mechanisms for testing boards integrated into the chip parts on the board, in which registers constituting the testing mechanisms are connected in a chain through a plurality of the chip parts;

a control unit for writing desired data into the registers connected in a chain by using a shift operation;

a memory connected to at least one of a plurality of the chip parts;

an address registers in which an address for designating data to be read out from the memory is set, provided in one of the testing mechanisms associated with the chip part connected to the memory in parallel with other registers in the one testing mechanism;

a selector for selecting and sending out either test data outputs read out from the testing mechanisms by the shift operation or read-out data read out from the memory, designated by the address of the address register whereby said control unit controls such that a leading address of the data to be read out from the memory is sent to the address register by the shift operation, the selector is switched so as to send out the read-out data from the memory, and thereafter, while the address of the address register is counted up in accordance with a data number to be read out, the data are read out from the memory by using the shift operation.

2. A processing system as claimed in claim 1, wherein:

each of the testing mechanisms is a JTAG circuit as a boundary scan architecture for testing boards;

each said JTAG circuit comprises a data register group including at least a boundary scan register for capturing and holding signals appearing on terminals of the one chip part into which the JTAG circuit is incorporated and a one-bit bypass register for sending out data transferred from a previous stage testing mechanism to a subsequent stage testing mechanism, an instruction register for storing an instruction to designate one of said registers in said data register group; a data register selector for selecting a register from the data register group in accordance with the instruction stored in the instruction register; and an output data selector for sending out data from the register selected by the data register selector;

the boundary scan register, the bypass register, and the instruction register of each of the JTAG circuits are connected through the output data selector of each of the JTAG circuits in a chain through a plurality of the chip parts; and the address register is provided in the data register group in parallel with the boundary scan register and the bypass register, in the JTAG circuit in one of the chip parts connected to the memory.

3. A processing system as claimed in claim 2, wherein the control unit sets a code for selecting the address register to the instruction register of the JTAG circuit in the one chip part to which the memory is connected, sets a code for selecting the bypass register to the instruction register of each of the JTAG circuits in the other chip parts, and thereafter sets the leading address of the data to be read out from the memory to the address register by the shift operation.

4. A processing system as claimed in claim 1, wherein:

the memory is a nonvolatile memory in which clock tuning data are stored in advance; and the control unit reads out the clock tuning data from the nonvolatile memory at a start-up of the processing system.

5. A processing system as claimed in claim 2, wherein:

the memory is a nonvolatile memory in which clock tuning data are stored in advance; and the control unit reads out the clock tuning data from the nonvolatile memory at a start-up of the processing system.

6. A processing system as claimed in claim 3, wherein:

the memory is a nonvolatile memory in which clock tuning data are stored in advance; and the control unit reads out the clock tuning data from the nonvolatile memory at a start-up of the processing system.

* * * * *